(12) United States Patent
Kimura

(10) Patent No.: US 7,726,013 B2
(45) Date of Patent: Jun. 1, 2010

(54) METHOD OF MANUFACTURING CIRCUIT BOARD INCLUDING TRANSFER CHIP HAVING A PLURALITY OF FIRST PAD ELECTRODES CONNECTED TO WIRING

(75) Inventor: Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 659 days.

(21) Appl. No.: 10/680,173

(22) Filed: Oct. 8, 2003

(65) Prior Publication Data

US 2004/0128829 A1    Jul. 8, 2004

(30) Foreign Application Priority Data

Oct. 8, 2002    (JP)    ............... 2002-295134

(51) Int. Cl.
*H05K 3/30*    (2006.01)
(52) U.S. Cl. .............. 29/832; 29/825; 29/846; 29/830; 29/831
(58) Field of Classification Search .......... 29/825, 29/846, 830, 831, 832, 847; 257/692, 693, 257/687, 777; 174/52.2, 52.4; 361/794; 430/120.2; 324/754
See application file for complete search history.

(56) References Cited

U.S. PATENT DOCUMENTS

| | | | |
|---|---|---|---|
| 4,808,983 A | | 2/1989 | Benjamin et al. |
| 5,250,843 A | * | 10/1993 | Eichelberger ............... 257/692 |
| 5,384,691 A | * | 1/1995 | Neugebauer et al. ........ 361/794 |
| 5,566,448 A | * | 10/1996 | Bhatt et al. ................... 29/847 |
| 5,679,493 A | * | 10/1997 | Kai .......................... 430/120.2 |
| 5,843,251 A | * | 12/1998 | Tsukagoshi et al. ........... 156/64 |
| 6,612,024 B1 | * | 9/2003 | Sasaki et al. .................. 29/840 |
| 6,977,441 B2 | * | 12/2005 | Hashimoto .................. 257/777 |
| 7,202,677 B2 | * | 4/2007 | Pedersen et al. ............ 324/754 |
| 2003/0094619 A1 | | 5/2003 | Akiyama | |

FOREIGN PATENT DOCUMENTS

| | | |
|---|---|---|
| DE | 40 32 397 A1 | 4/1992 |
| JP | A-03-016147 | 1/1991 |
| JP | A-06-502744 | 3/1994 |
| JP | A-10-041349 | 2/1998 |
| JP | A 10-125931 | 5/1998 |
| JP | A-2001-168339 | 6/2001 |
| JP | A 2002-182582 | 6/2002 |
| JP | A-2002-244576 | 8/2002 |
| JP | A 2002-261335 | 9/2002 |
| JP | A 2002-311858 | 10/2002 |
| JP | A 2002-314052 | 10/2002 |
| JP | A 2002-314123 | 10/2002 |
| JP | A 2002-343944 | 11/2002 |
| JP | A 2002-368282 | 12/2002 |

* cited by examiner

*Primary Examiner*—Rick K Chang
(74) *Attorney, Agent, or Firm*—Oliff & Berridge, PLC

(57) ABSTRACT

A circuit board manufacturing method, including forming a transfer chip, the forming of the transfer chip including, forming a wiring above a first substrate, forming a plurality of first pad electrodes so as to be connected to the wiring and so as to be included in the transfer chip, and joining the transfer chip with a member such that the plurality of first pad electrodes contact the member.

5 Claims, 11 Drawing Sheets

SECTIONAL VIEW TAKEN ALONG LINE A-A'

SECTIONAL VIEW TAKEN ALONG LINE B-B'

SECTIONAL VIEW TAKEN ALONG LINE C-C'

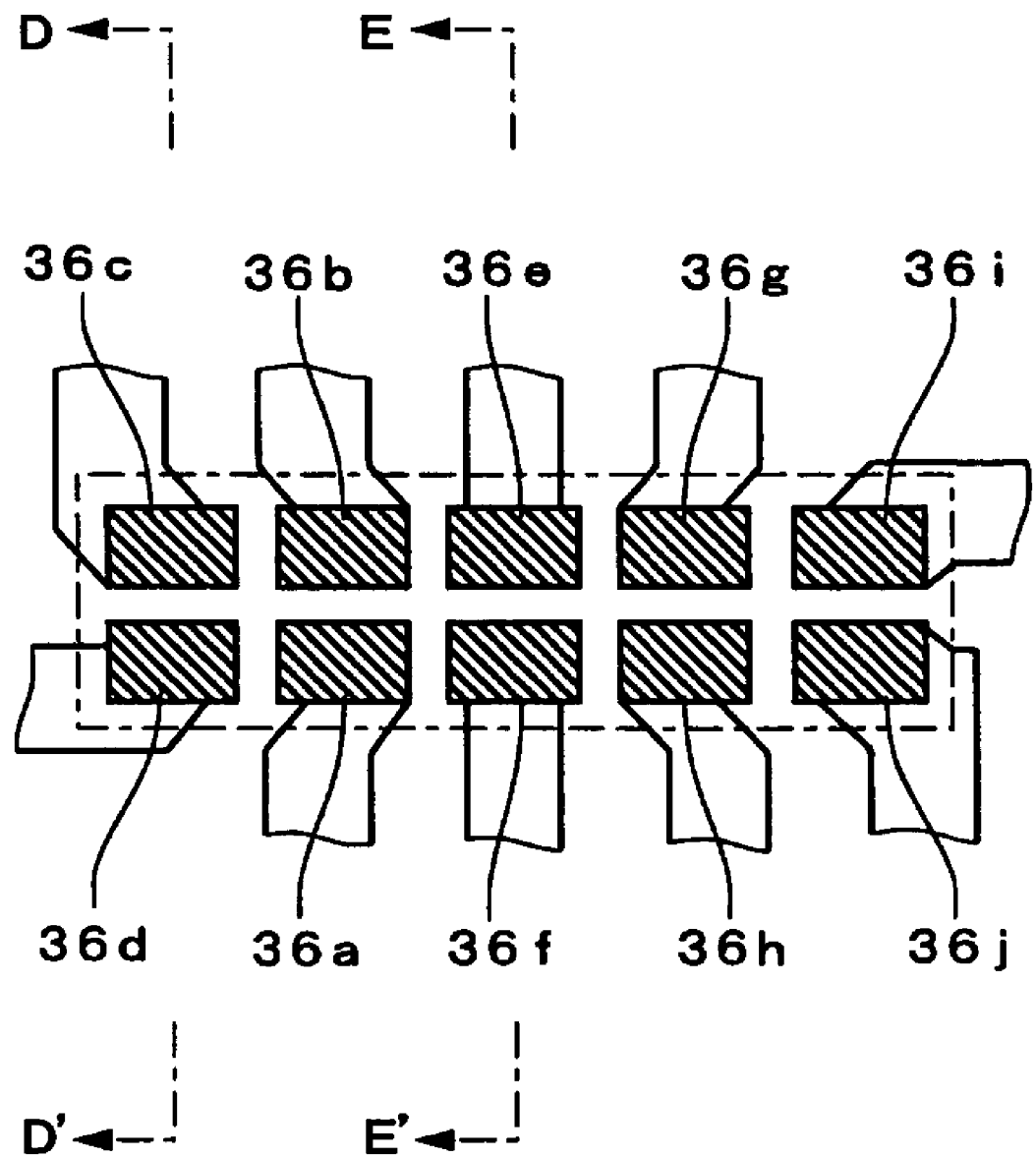

SECTIONAL VIEW TAKEN ALONG LINE D-D'

SECTIONAL VIEW TAKEN ALONG LINE E-E'

Fig. 10
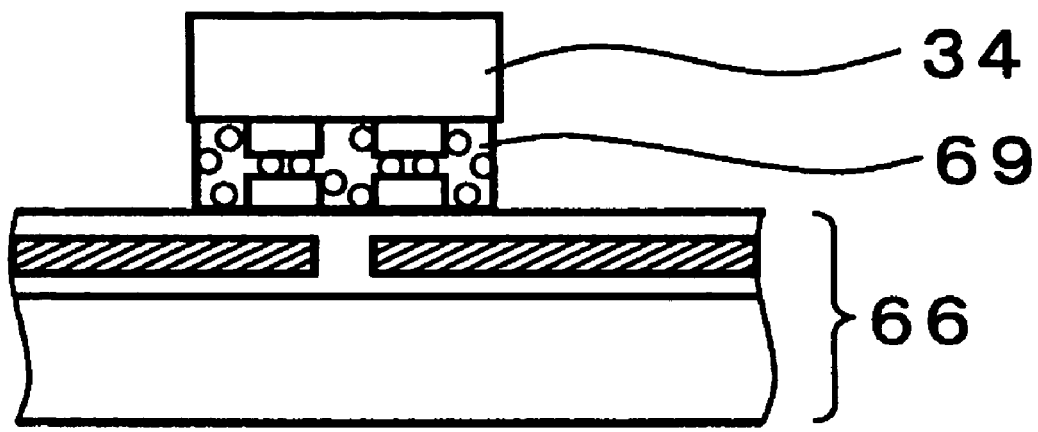
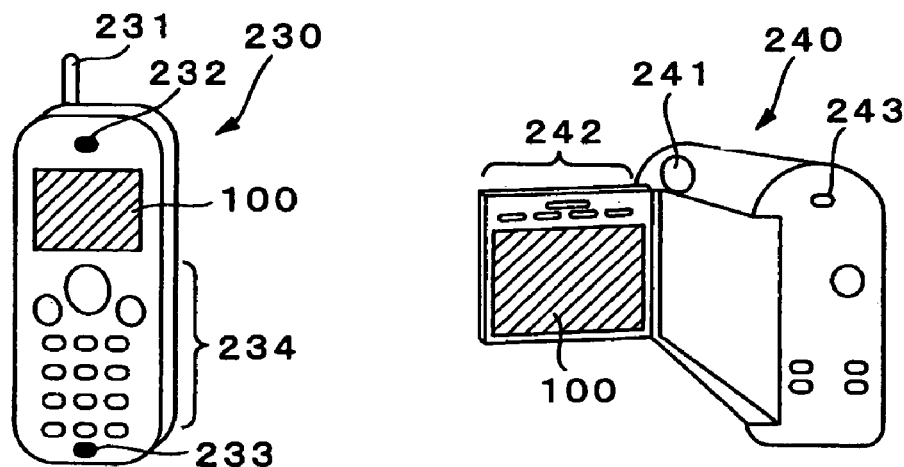
Fig.11A
Fig.11B
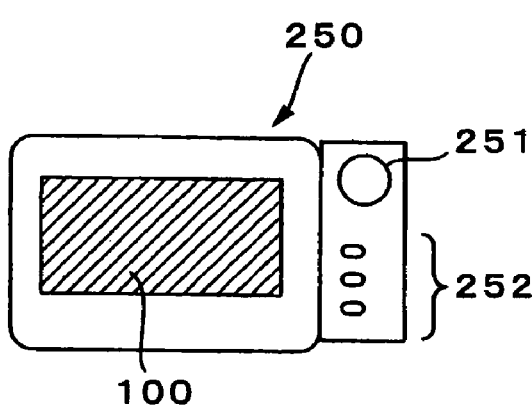
Fig.11C
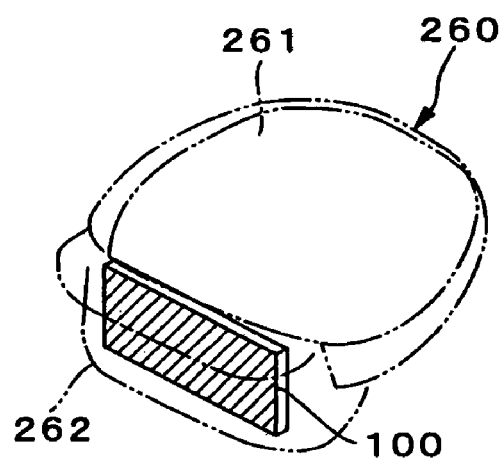
Fig.11D

METHOD OF MANUFACTURING CIRCUIT BOARD INCLUDING TRANSFER CHIP HAVING A PLURALITY OF FIRST PAD ELECTRODES CONNECTED TO WIRING

BACKGROUND OF THE INVENTION

1. Field of Invention

The present invention relates to transferring a pattern of an electrical circuit from one substrate to another substrate, to a display device (electro-optical device) using this technology, and to a method of manufacturing the same.

2. Description of Related Art

In related art display devices (electro-optical devices) in which pixels are driven by thin-film transistors (TFTs), such as a TFT-driven liquid crystal display (LCD), a TFT-driven organic electroluminescent display device, a TFT-driven light-emitting diode (LED) display device, and a TFT-driven electrophoretic display device, TFTs are part of the overall device. In most cases, the remaining significant part of the device includes lines, a support substrate, etc. In manufacturing such a display device (TFT-driven display device), when TFTs, lines and a support substrate are integrally formed in the same processes, an advanced and complicated manufacturing process of producing TFTs is necessary. As a result, the manufacturing cost becomes generally high. In contrast, such an advanced and complicated manufacturing process is unnecessary to produce lines and a support substrate, and the manufacturing cost is thus low. If TFTs are produced separately from lines and a support substrate and then arranged at necessary positions, the manufacturing cost of a TFT-driven display device can be reduced.

To satisfy such a demand, a transfer method is developed including: forming a to-be-transferred layer including elements, such as TFTs, on a transfer source substrate, the to-be-transferred layer being separated from the transfer source substrate by an ablation layer; joining the transfer source substrate including these layers to a transfer destination substrate; and irradiating the ablation layer with light to cause ablation, thereby removing the transfer source substrate from the ablation layer to form elements at desired positions on the transfer destination substrate. Such a transfer method is disclosed in, for example, Japanese Unexamined Patent Application Publication No. 10-125931. Using the above-described transfer method, TFTs are arranged only at necessary positions. Averaging the cost of all the components, the overall manufacturing cost of this TFT-driven display device is reduced.

SUMMARY OF THE INVENTION

In many cases, when a to-be-transferred piece (transfer chip) consisting of a circuit including TFTs and the like is transferred to a desired transfer destination substrate (e.g., a substrate included in a display device) using the above-described transfer method, the to-be-transferred piece and the transfer destination substrate are each provided with pad electrodes (connection terminals to establish electrical connections) which are associated with each other, and thus electrical connections are established between the elements included in the to-be-transferred piece and wiring and the like on the transfer destination substrate. In this case, reliable establishment of electrical connections between the pad electrodes on the to-be-transferred piece and the pad electrodes on the transfer destination substrate is important to increase the yield of good final products, such as display devices, including transfer destination substrates, to reduce cost, and to improve performance, such as durability.

Accordingly, the present invention ensures satisfactory electrical connections when electrical connections are established between pad electrodes on a to-be-transferred piece and pad electrodes on a transfer destination substrate.

In order to address or achieve the foregoing, a circuit board manufacturing method of the present invention includes a transfer chip forming step of forming, on a first substrate, a transfer chip including a thin-film electrical circuit formed of stacked films and a plurality of first pad electrodes used as connection terminals to establish connections between the thin-film electrical circuit and another circuit; a transfer destination substrate forming step of forming a second substrate including electrical circuit wiring and a plurality of second pad electrodes connected to the electrical circuit wiring and arranged in a transfer target region, the second pad electrodes being respectively associated with the first pad electrodes provided on the transfer chip; and a transfer step of transferring the transfer chip on the first substrate to the transfer target region on the second substrate to connect the thin-film electrical circuit to the electrical circuit wiring, thereby forming a circuit board. The first pad electrodes are arranged over the entire surface of the transfer chip and cover thin-film elements or thin-film wiring included in the thin-film electrical circuit provided below the first pad electrodes, whereby the tops of rough surface portions of the pad electrodes have approximately the same height.

The "transfer chip" in the present invention is the minimum unit of transfer (serving as a to-be-transferred piece) when the above-described transfer technology is used. Specifically, in ablation transfer technology, a to-be-transferred piece is formed on a substrate serving as a transfer source, and then the to-be-transferred piece is transferred to a transfer destination substrate (for example, a substrate included in a final product) differing from the transfer source substrate. For example, the transfer chip performs a predetermined function when combined with various elements or a circuit including a set of these elements.

When a circuit is formed by providing pad electrodes to establish electrical connections between the transfer chip serving as the to-be-transferred piece and the transfer destination substrate (second substrate), it is preferable that the size of each pad electrode (contact area) be relatively large for convenience of the alignment accuracy upon transfer or the like. To this end, the pad electrodes are often arranged over the entire surface (transfer face) of the transfer chip, occupying a large area of the surface of the transfer chip. In this case, however, since the pad electrodes (first pad electrodes) on the transfer chip are formed, crossing various portions of the thin-film electrical circuit, it is difficult to prevent the surface from becoming rough. These rough surfaces of the pad electrodes often cause contact failure when the transfer chip is transferred.

According to the present invention, the pad electrodes are formed so that the tops of rough surface portions of the pad electrodes, that is, the highest portions of the pad electrodes, have approximately the same height. Accordingly, upon transfer of the transfer chip to the transfer target region on the transfer destination substrate, contact areas can be adjusted approximately to the same height. As a result, satisfactory connections are reliably established.

Preferably, the heights of the tops of the rough portions of the first pad electrodes are adjusted by adding height adjusting films when forming the thin-film elements or the thin-film wiring. Accordingly, the heights of the tops of the rough portions are easily adjusted. Such height adjusting films may be formed using, for example, semiconductor films or conductive films used in forming the above-described thin-film elements and the like or insulating films provided therebetween. In this case, the height adjusting films can be formed at the same time the thin-film elements and the like are formed, which is advantageous because there is no increase in the number of steps or complexity. Alternatively, the height adjusting films may be formed separately from a thin film to form the thin-film elements and the like.

Preferably, in the transfer destination substrate forming step, the second pad electrodes are formed to cover the electrical circuit wiring provided therebelow, whereby the tops of rough surface portions of the second pad electrodes have approximately the same height. Accordingly, even when the transfer target region on the transfer destination substrate (second substrate) is not even and when the surfaces of the second pad electrodes formed in the transfer target region are rough, contact areas of the transfer target region on the transfer destination substrate being in contact with the transfer chip are adjusted approximately to the same height. Therefore, satisfactory electrical connections can be reliably established.

Preferably, the heights of the tops of the rough portions of the second pad electrodes are adjusted by adding height adjusting films when forming the electrical circuit wiring. Accordingly, the heights of the tops of the rough portions are easily adjusted. Such height adjusting films may be formed using, for example, conductive films or insulating films used in forming the above-described electrical circuit wiring. In this case, the height adjusting films can be formed at the same time the electrical circuit wiring is formed, which is advantageous because there is no increase in the number of steps or complexity. Alternatively, the height adjusting films may be formed separately from a thin film to form the electrical circuit wiring.

Preferably, the first pad electrodes have the same film structure of the stacked films in regions associated with the tops. Preferably, the second pad electrodes have the same film structure of the lower stacked films in regions associated with the tops. In the present invention, that the pad electrodes have "the same film structure" means one or all of the following conditions: they have the same film thickness; they are made of the same film material; and/or they are made by the same film deposition method. In this way, when the tops are made to have the same film structure, various characteristics (e.g., electrical conductivity, mechanical strength, etc.) of the tops of the pad electrodes are made to be more uniform so that electrical connection states and reliability can be further enhanced.

A circuit board manufacturing method of the present invention includes a transfer chip forming step of forming, on a first substrate, a transfer chip including a thin-film electrical circuit formed of stacked films and a plurality of first pad electrodes used as connection terminals to establish connections between the thin-film electrical circuit and another circuit; a transfer destination substrate forming step of forming a second substrate including electrical circuit wiring and a plurality of second pad electrodes connected to the electrical circuit wiring and arranged in a transfer target region, the second pad electrodes being respectively associated with the first pad electrodes provided on the transfer chip; and a transfer step of transferring the transfer chip on the first substrate to the transfer target region on the second substrate to connect the thin-film electrical circuit to the electrical circuit wiring, thereby forming a circuit board. The first pad electrodes are arranged over the entire surface of the transfer chip and cover thin-film elements or thin-film wiring included in the thin-film electrical circuit provided below the first pad electrodes. The second pad electrodes are arranged over the entire transfer target region so as to be associated with the arrangement of the first pad electrodes and cover the electrical circuit wiring provided therebelow. The first pad electrodes and the second pad electrodes are formed so that the sums of the heights of tops of rough surface portions of respective pairs of the first and second pad electrodes facing each other are approximately constant.

As described above, it is preferable that the size (contact area) of each of the pad electrodes formed on the transfer chip and on the transfer destination substrate (second substrate) be relatively large. To this end, the pad electrodes are formed, crossing various portions of the thin-film electrical circuit or the electrical circuit wiring. It thus becomes difficult to prevent the surface from becoming rough. These rough surfaces of the pad electrodes often cause contact failure when the transfer chip is transferred.

Accordingly, in the present invention, the first and second electrodes are formed such that each pair of the first and second pad electrodes facing each other can have approximately constant sum of the height of the tops of the rough surface portions. As a result, the first and second pad electrodes facing each other are reliably connected with each other, thus reliably establishing satisfactory electrical connections.

In addition, according to the present invention, the heights of the tops of the first and second pad electrodes are preferably adjusted using the above-described height adjusting films. Furthermore, preferably, the tops of the first and second pad electrodes have the same film structure. Advantages achieved by this arrangement are described as above.

According to the respective aspects of the present invention described above, preferably, the transfer step includes forming adhesive layers between the first pad electrodes provided on the transfer chip and the second pad electrodes provided on the second substrate. This makes the connections between the first and second pad electrodes firmer and more reliable. Each of the adhesive layers is preferably formed using, for example, a conductive adhesive or an anisotropic conductive film including conductive particles.

Preferably, the transfer chip forming step includes forming an ablation layer between the first substrate and the transfer chip, the ablation layer having a characteristic such that the adhesiveness with respect to the transfer chip is weakened due to a change of state in response to application of energy. Accordingly, upon transfer, the transfer chip is easily ablated from the second substrate. Energy can be applied by various methods, such as by applying heat or performing light irradiation. A particularly preferable method is a light irradiation method using laser light or the like. With such a light irradiation method, energy can be applied to an arbitrary region, and hence alignment is accomplished accurately.

According to the present invention, there is provided a transfer chip serving as a transfer unit including at least a thin-film electrical circuit formed of stacked films and a plurality of pad electrodes to establish connections between the thin-film electrical circuit and another circuit. The transfer chip is formed on a first substrate and to be transferred from the first substrate to a second substrate having wiring. The pad electrodes are arranged over the entire surface of the transfer chip and cover thin-film elements or thin-film wiring included in the thin-film electrical circuit provided below the pad electrodes, whereby the tops of rough surface portions of the pad electrodes have approximately the same height.

With this arrangement, upon transfer of the transfer chip to the transfer target region on the transfer destination substrate (second substrate), contact areas can be adjusted approximately to the same height. Therefore, satisfactory electrical connections are established.

According to the present invention, there is also provided a transfer source substrate including a plurality of above-described transfer chips according to the present invention arranged on the substrate. Preferably, the transfer source substrate further includes an ablation layer between the substrate and the transfer chips, the ablation layer having a characteristic such that the adhesiveness with respect to the transfer chips is weakened due to a change of state in response to application of energy.

According to the present invention, there is also provided an electro-optical device manufactured using a circuit board manufactured by the above-described manufacturing method according to the present invention. More specifically, the present invention provides an electro-optical device including the above-described circuit board and electro-optical elements whose operation is controlled by the circuit board. Alternatively, the present invention provides an electro-optical device manufactured using the above-described transfer chip or the above-described transfer source substrate. Accordingly, the yield of good electro-optical devices is increased, cost is reduced, and performance, such as durability, is enhanced. The "electro-optical device" according to the present invention includes a display device including various electro-optical elements, such as electroluminescent (EL) elements, light emitting elements, plasma light emitting elements, electrophoretic elements, liquid crystal elements, etc.

According to the present invention, there is also provided an electronic apparatus using the above-described electro-optical device according to the present invention as a display unit. The electronic apparatus includes a video camera, a cellular phone, a personal computer, a personal digital assistant (so called PDA), and various other apparatuses, for example. Using the electro-optical device according to the present invention, the yield of good electronic apparatuses is increased, cost is reduced, and performance, such as durability, is enhanced.

BRIEF DESCRIPTION OF THE DRAWINGS

FIG. 6 is a schematic describing the pad electrodes formed on the pixel;

FIG. 10 is a schematic describing a case in which an adhesive layer is formed using an anisotropic conductive film;

FIGS. 11A-11D are schematics showing specific examples of electronic apparatuses to which the organic EL display device is applicable;

DETAILED DESCRIPTION OF PREFERRED EMBODIMENTS

A TFT-driven display device according to an exemplary embodiment of the present invention is described below. In this exemplary embodiment, an organic EL display device including organic EL elements, which are one type of electro-optical elements, is described as an example of a TFT-driven display device.

Figure 1:
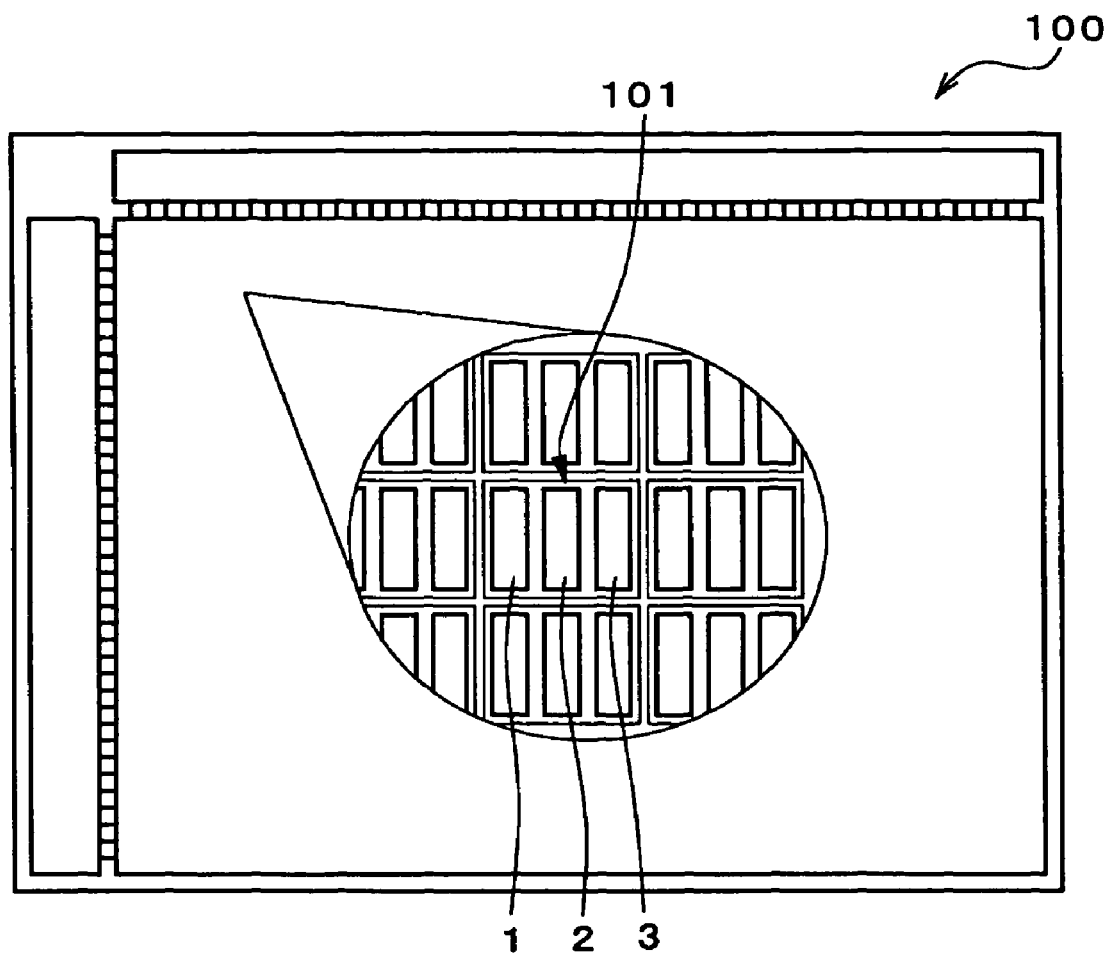
FIG. 1 is a schematic showing the configuration of an organic EL display device.

FIG. 1 is a schematic showing the configuration of an organic EL display device of this exemplary embodiment. An organic EL display device 100 shown in the illustration includes a matrix of many pixels (basic pixels) 101, each pixel including three color pixels 1, 2, and 3. Of the color pixels, for example, color pixel 1 corresponds to red, color pixel 2 corresponds to green, and color pixel 3 corresponds to blue. Each pixel 101 is driven by a chip including a drive circuit (thin-film electrical circuit) formed of a plurality of thin-film transistors (TFTs).

Figure 2A:
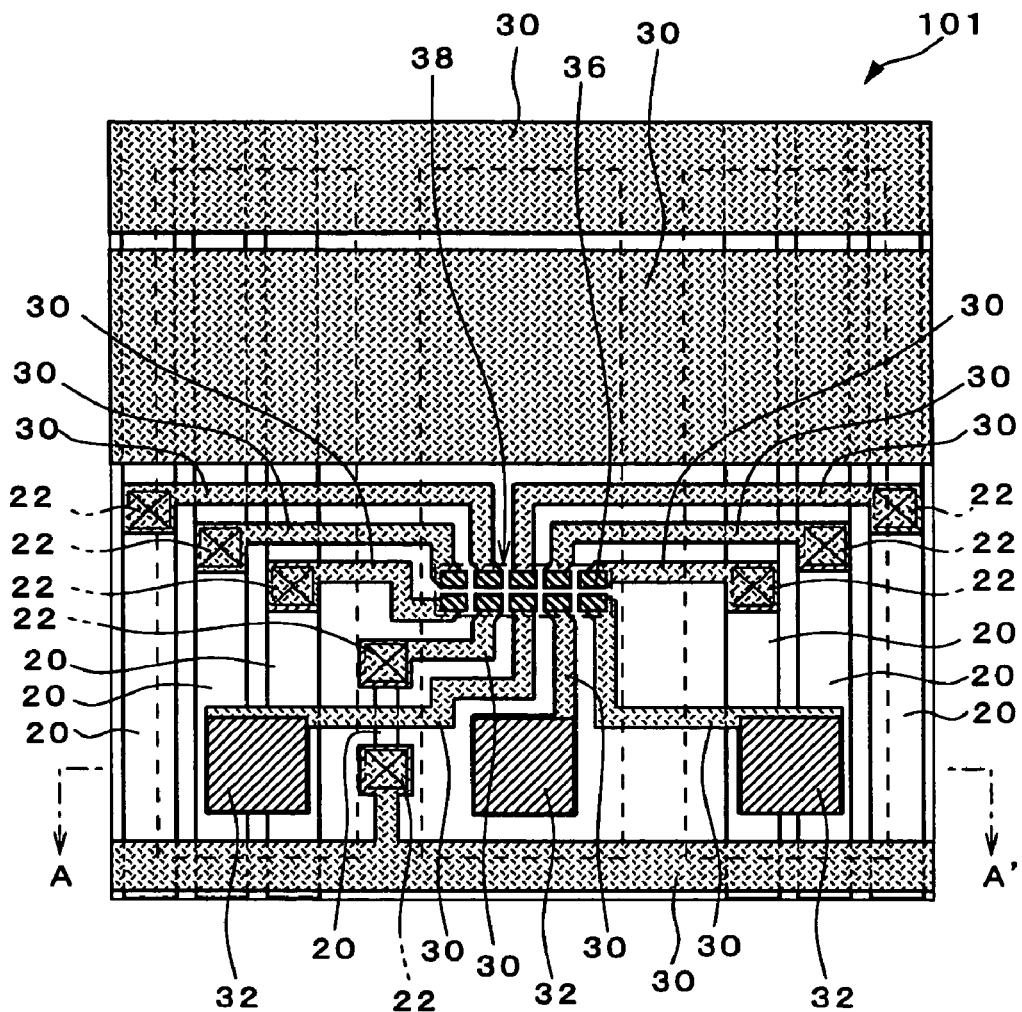
FIGS. 2A and 2B are schematics describing the structure of each pixel.
Figure 2B:
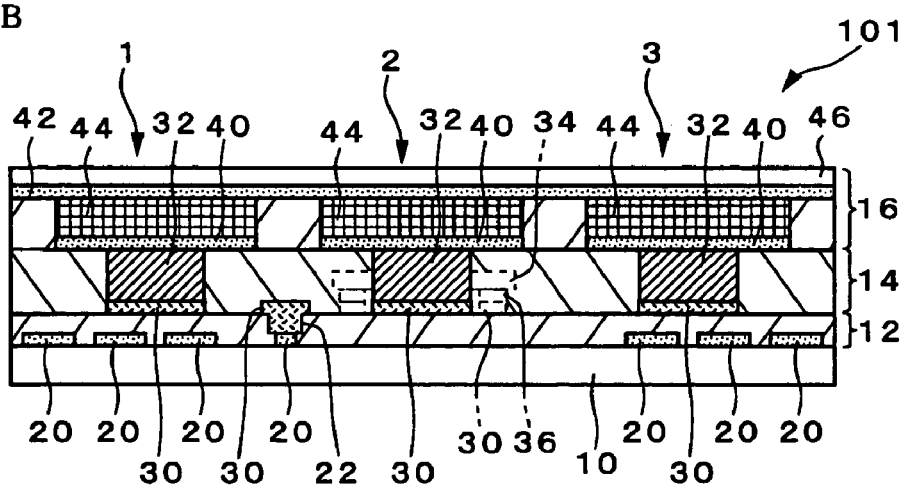

FIGS. 2A and 2B are schematics describing the structure of each pixel 101. FIG. 2A is a plan view of the pixel 101, and FIG. 2B is a sectional view taken along Plane A-A' of FIG. 2A. In FIG. 2A, some of the components are omitted to simplify the description.

As shown in FIGS. 2A and 2B, the pixel 101 is formed on a substrate 10 formed of an insulating material, such as glass or the like by laminating, from the bottom, a first wiring layer 12, a second wiring layer 14, and a light emitting element layer 16 to form a multilayer structure. In FIG. 2A, to describe the structure of the first and second wiring layers, part of the second wiring layer 14 and the light emitting device layer 16 are omitted.

The first wiring layer 12 includes lines 20 provided on the substrate 10 and apertures 22 to electrically connect the lines 20 to lines (described below) included in the second wiring layer 14. The lines included in the second wiring layer 14 are partially in contact with the lines 20 via the apertures 22, thus establishing electrical connections therebetween. Insulating member (e.g., silicon oxide) are provided between the lines 20. In FIG. 2A, these insulating members are omitted.

The second wiring layer 14 includes lines 30 provided on the first wiring layer 12, plugs 32 to electrically connect the lines 30 with electrodes (described below) included in the light emitting element layer 16, a chip 34 to drive the light emitting element layer 16, and a pad group 38 including a plurality of pad electrodes 36 to electrically connect the chip 34 to the lines 30. Although not shown in FIG. 2A, insulating members (e.g., silicon oxide) are provided between the lines 30 and between the plugs 32. Although the chip 34 is also omitted in FIG. 2A, the chip 34 is provided on the pad group 38.

In this exemplary embodiment, the first wiring layer 12 and the second wiring layer 14 constitute electrical circuit wiring. The chip 34 includes a plurality of TFTs which can control color pixels 1, 2, and 3 included in each pixel 101 individually. The chip 34 is formed on another substrate (transfer source substrate), differing from the substrate 10. The chip 34 is to be ablated from the transfer source substrate and transferred to the substrate 10. The chip 34 corresponds to a "transfer chip". A transfer method is described in detail below.

The light emitting element layer 16 includes three pixel electrodes 40 provided on the second wiring layer 14, a common electrode 42 facing these pixel electrodes 40, three light emitting layers 44 disposed between the pixel electrodes 40 and the common electrode 42, and a protective layer 46 provided on the common electrode 42. Insulating members (e.g., silicon oxide) are provided between the pixel electrodes 40 and between the light emitting layers 44. The pixel electrodes 40, the light emitting layers 44 stacked on the pixel electrodes 40, and the common electrode 42 form three light emitting elements (electro-optical elements). These light emitting elements serve as the color pixels 1, 2, and 3, respectively. The chip 34 individually supplies current via the pixel electrodes 40 to the light emitting layers 44, and the color pixels 1, 2, and 3 are individually switched ON and OFF.

The internal structure of the chip 34 of this exemplary embodiment is described in detail below using a specific example.

Figure 3:
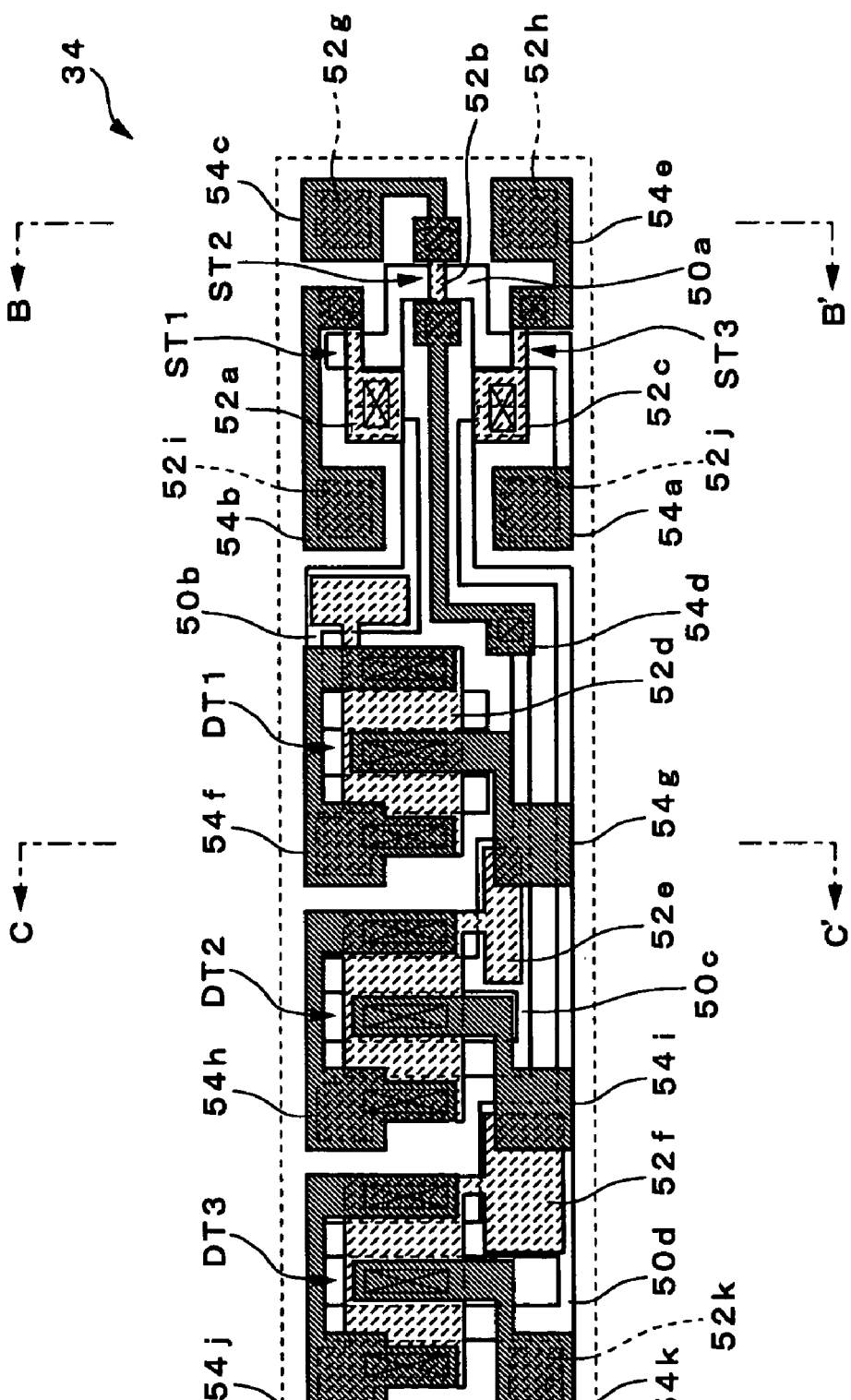
FIG. 3 is a plan view showing the internal structure of a chip.

FIG. 3 is a plan view showing the internal structure of the chip 34. In FIG. 3, to simplify the structure of thin-film transistors (TFTs) and thin-film wiring included in the chip 34, components provided on top of these TFTs and the like are omitted. These omitted components are described below.

As shown in FIG. 3, the chip 34 includes three switching TFTs, ST1, ST2, and ST3 arranged in the vertical direction in the right region and three driving TFTs, DT1, DT2, and DT3 arranged in the horizontal direction in the left region.

In this exemplary embodiment, each color pixel is driven by a pixel circuit including a set of one switching TFT and one driving TFT. Specifically, the switching TFT ST1 shown in FIG. 3 activates the driving TFT DT1 in response to an input signal (scanning signal). The driving TFT DT1 in turn controls current flowing through the light emitting layer 44 included in the color pixel 1. Similarly, a pixel circuit including a set of the switching TFT ST2 and the driving TFT DT2 controls current flowing through the light emitting layer 44 included in the color pixel 2. A pixel circuit including a set of the switching TFT ST3 and the driving TFT DT3 controls current flowing through the light emitting layer 44 included in the color pixel 3.

The respective switching TFTs and the respective driving TFTs include a first thin-film wiring layer; a semiconductor layer provided on the first thin-film wiring layer, the semiconductor layer including a semiconductor film forming an active region of the corresponding TFT; and a second thin-film wiring layer provided on the semiconductor layer. In FIG. 3, to clearly distinguish among these layers, the first thin-film wiring layer is outlined on the white background, the semiconductor layer is marked with hatching of widely-spaced oblique lines sloping downward to the right, and the second thin-film wiring layer is marked with hatching of thinly-spaced oblique lines sloping upward to the right. Insulating layers made of $SiO_2$ or the like are provided between the layers.

With reference to FIG. 3, the first thin-film wiring layer, the semiconductor layer, and the second thin-film wiring layer and the structure thereof are described in detail below.

The first thin-film wiring layer includes thin-film lines 50a to 50d. The thin-film line 50a serves as the gate electrode of the switching TFTs ST1, ST2, and ST3, respectively, and is electrically connected to a thin-film line 54a included in the second thin-film wiring layer. By supplying a scanning signal to the thin-film line 50a via the thin-film line 54a, the operation of the switching TFTs ST1, ST2, and ST3 can be controlled.

Although not shown in FIG. 3, the thin-film line 54a is actually electrically connected to a pad electrode (connection terminal to establish an electrical connection) provided on the top side of the second thin-film wiring layer. From outside of the chip 34, a scan signal is transferred via this pad electrode to the thin-film line 54a. A detailed description of the pad electrode is provided below. In this exemplary embodiment, one common line is used to supply scanning signals to the switching TFTs ST1, ST2, and ST3, resulting in a reduction in the area required to form the first thin-film wiring layer. At the same time, the number of pad electrodes is reduced, resulting in a reduction in the size of the chip 34. Since the number of pad electrodes (in other words, points of connection) is reduced, the frequency of occurrence of connection failure upon transfer is reduced.

The thin-film line 50b is electrically connected to a semiconductor film 52a. The thin-film line 50b carries out a function of transferring current supplied from the switching TFT ST1 to the driving TFT DT1. At the same time, the thin-film line 50b serves as the gate electrode of the driving TFT DT1.

The thin-film line 50c is electrically connected to a semiconductor film 52b via a thin-film line 54d included in the second thin-film wiring layer. The thin-film line 50c carries out a function of transferring current supplied from the switching TFT ST2 to the driving TFT DT2. At the same time, the thin-film line 50c serves as the gate electrode of the driving TFT DT2.

The thin-film line 50d is electrically connected to a semiconductor film 52c. The thin-film line 50d carries out a function of transferring current supplied from the switching TFT ST3 to the driving TFT DT3. At the same time, the thin-film line 50d serves as the gate electrode of the driving TFT DT3.

The semiconductor layer includes the semiconductor films 52a to 52k. The semiconductor film 52a is connected at one end to a thin-film line 54b and at the other end to the thin-film line 50b and serves as an active region of the switching TFT ST1. The semiconductor film 52b is connected at one end to a thin-film line 54c and at the other end to the thin-film line 54d and serves as an active region of the switching TFT ST2. The semiconductor film 52c is connected at one end to a thin-film line 54e and at the other end to the thin-film line 50d and serves as an active region of the switching TFT ST3.

The semiconductor film 52d is connected to thin-film lines 54g and 54f and to a pad electrode (not shown), which will be described later, and serves as an active region of the driving TFT DT1. The semiconductor film 52e is connected to thin-film lines 54h and 54i and to a pad electrode (not shown), which is described below, and serves as an active region of the driving TFT DT2. The semiconductor film 52f is connected to thin-film lines 54j and 54k and to a pad electrode (not shown), which is described below, and serves as an active region of the driving TFT DT3.

The semiconductor film 52g is arranged under the thin-film line 54c and used to adjust the height of a pad electrode arranged on the thin-film line 54c. Similarly, the semiconductor film 52h is arranged under the thin-film line 54e and used to adjust the height of a pad electrode arranged on the thin-film line 54e. The same applies to the semiconductor films 52i, 52j, and 52k. The semiconductor films 52i, 52j, and 52k are used to adjust the heights of pad electrodes arranged on the thin-film line 54b, 54a, and 54k, respectively. A detailed description of the pad electrodes (particularly a method of defining the "height" of each pad electrode) is given below.

Accordingly, in this exemplary embodiment, when the semiconductor films serving as the active regions of the TFTs are formed, the semiconductor films for adjusting the heights of the pad electrodes, that is, the "height adjusting films", are further formed. Accordingly, the heights of the pad electrodes can be adjusted appropriately without causing an increase in the number of steps or complication of the manufacturing process. Incidentally, instead of using the semiconductor films, the height adjusting films may be formed using thin-film lines or insulating films.

The second thin-film wiring layer includes the thin-film lines 54a to 54k. Pad electrodes arranged on the second thin-film wiring layer, which establish electrical connections between the internal circuit of the chip 34 and the outside, are described below including the connections with the thin-film lines 54a to 54k.

Figure 4:
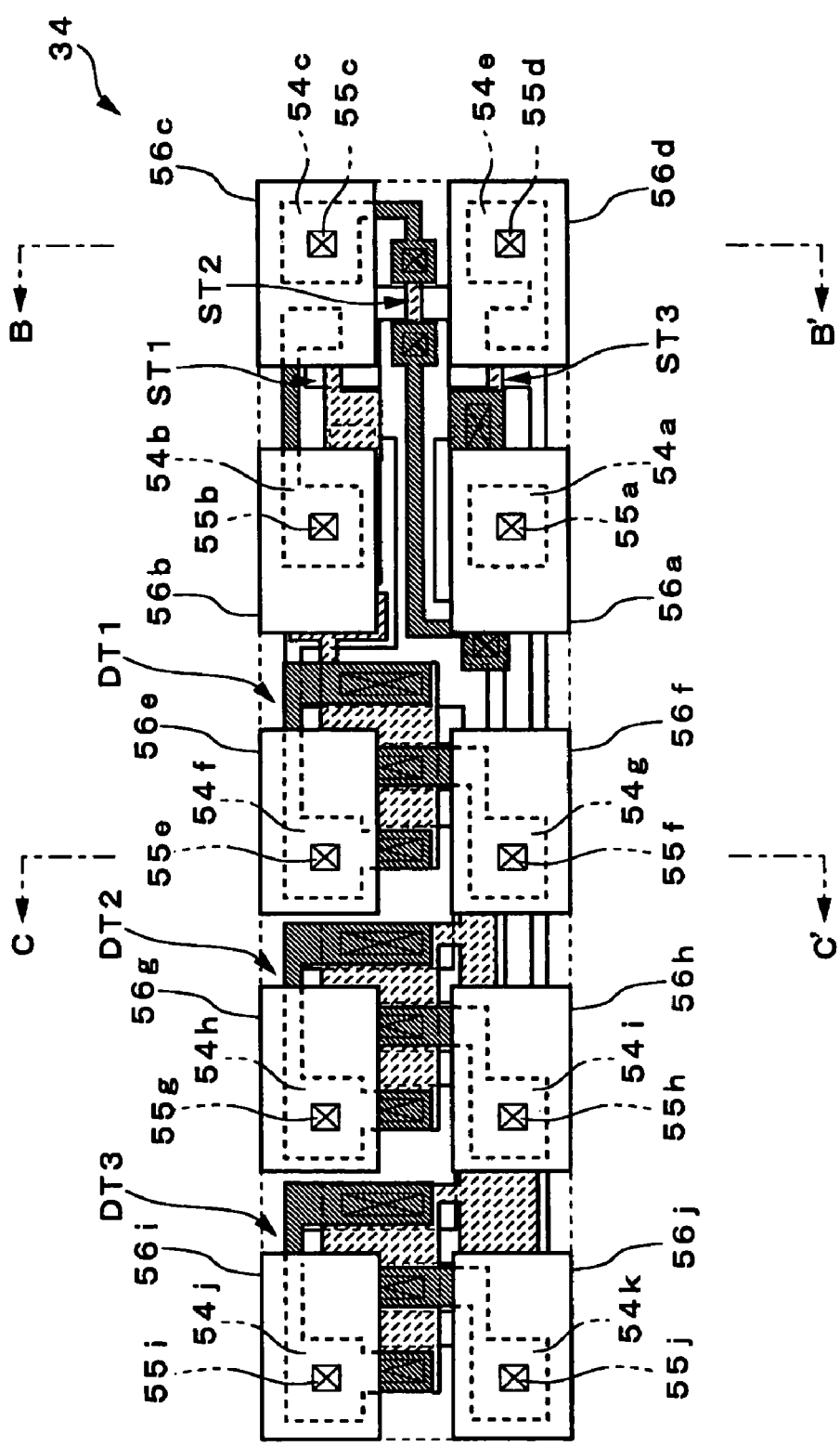
FIG. 4 is a schematic describing pad electrodes.

FIG. 4 shows pad electrodes. As shown in the illustration, ten pad electrodes 56a to 56j are arranged on the second thin-film wiring layer of the chip 34. These pad electrodes 56a to 56j are adapted to make a pair with the respective pad electrodes 36 (see FIGS. 2A and 2B) included in the above-described pixel 101. The chip 34 shown in FIG. 4 is transferred by reversing the chip 34 so as to make the pad electrodes 56a and the like face the pad electrodes 36 of the pad group 38 included in the above-described pixel 101 shown in FIGS. 2A and 2B, and by bringing them together. A detailed description of the method of transferring the chip 34 is given below.

The pad electrode 56a is electrically connected to the thin-film line 54a via an aperture 55a formed in an insulating film on the second thin-film wiring layer. A scanning signal from the outside is supplied via the pad electrode 56a to the thin-film line 54a to drive the switching transistors ST1 to ST3. The pad electrode 56b is electrically connected to the thin-film line 54b via an aperture 55b formed in the insulating film on the thin-film line 54b. External current is supplied via the pad electrode 56b to the thin-film line 54b to supply current to the active region of the switching TFT ST1. The pad electrode 56c is electrically connected to the thin-film line 54c via an aperture 55c formed in the insulating film on the thin-film line 54c. External current is supplied via the pad electrode 56c to the thin-film line 54c to supply current to the active region of the switching TFT ST2. The pad electrode 56d is electrically connected to the thin-film line 54e via an aperture 55d formed in the insulating film on the thin-film line 54e. External current is supplied via the pad electrode 56d to the thin-film line 54e to supply current to the active region of the switching TFT ST3.

The pad electrode 56e is electrically connected to the thin-film line 54f via an aperture 55e formed in the insulating film on the thin-film line 54f. External current is supplied via the pad electrode 56e to the thin-film line 54f to supply current to the active region of the driving TFT DT1. The pad electrode 56f is electrically connected to the thin-film line 54g via an aperture 55f formed in the insulating film on the thin-film line 54g. The pad electrode 56f is electrically connected to one of the above-described pad electrodes 36. Current output from the driving TFT DT1 is supplied to the color pixel 1 via the thin-film line 54g, the pad electrode 56f, and the pad electrode 36 that is electrically connected to the pad electrode 56f.

The pad electrode 56g is electrically connected to the thin-film line 54h via an aperture 55g in the insulating film on the thin-film line 54h. External current is supplied via the pad electrode 56g to the thin-film line 54h to supply current to the active region of the driving TFT DT2. The pad electrode 56h is electrically connected to the thin-film line 54i via an aperture 55h in the insulating film on the thin-film line 54i. The pad electrode 56h is electrically connected to one of the pad electrodes 36. Current output from the driving TFT DT2 is supplied to the color pixel 2 via the thin-film line 54i, the pad electrode 56h, and the pad electrode 36 that is electrically connected to the pad electrode 56h.

The pad electrode 56i is electrically connected to the thin-film line 54j via an aperture 55i in the insulating film on the thin-film line 54j. External current is supplied via the pad electrode 56i to the thin-film line 54j to supply current to the active region of the driving TFT DT3. The pad electrode 56j is electrically connected to the thin-film line 54k via an aperture 55j in the insulating film on the thin-film line 54k. The pad electrode 56j is electrically connected to one of the pad electrodes 36. Current output from the driving TFT DT3 is supplied to the color pixel 3 via the thin-film line 54k, the pad electrode 56i, and the pad electrode 36 that is electrically connected to the pad electrode 56i.

The heights of the pad electrodes 56a to 56j on the chip 34 are described below.

Figure 5A:
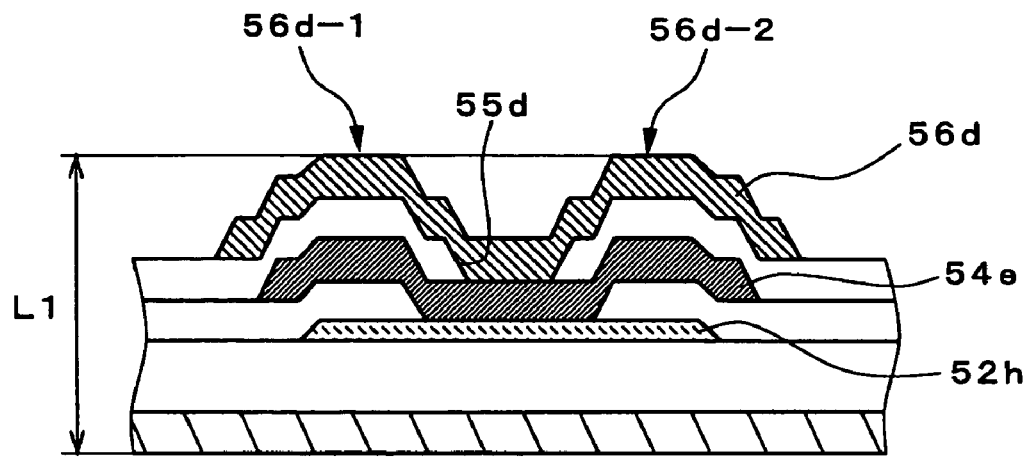
FIGS. 5A and 5B are schematics describing the heights of the pad electrodes.
Figure 5B:
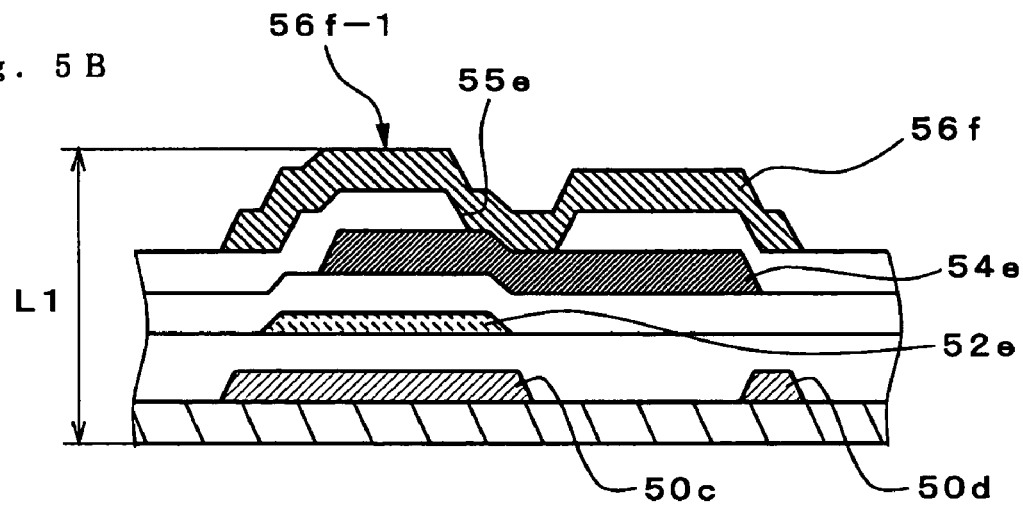

FIGS. 5A and 5B are schematics describing the heights of the pad electrodes. Specifically, FIG. 5A is a sectional view of the pad electrode 56d taken along Plane B-B' of FIGS. 3 and 4. FIG. 5B is a sectional view of the pad electrode 56f taken along Plane C-C' of FIGS. 3 and 4.

As shown in FIG. 5A, the pad electrode 56d includes two "tops", which have the greatest height (alienated distance) from the bottom of the chip 34. These two tops 56d-1 and 54d-2 have height L1 from the bottom of the chip 34. As shown in FIG. 5B, the pad electrode 56f has one top 56f-1. The top 56f-1 has height L1 from the bottom of the chip 34. Furthermore, each of the pad electrodes 56a and the like, which are not shown, has at least one top having height L1 from the bottom of the chip 34.

Specifically, since the plural pad electrodes 56a to 56j are formed on the top side of the thin-film electrical circuit including the thin-film wiring layers and the semiconductor layer, which are stacked on top of another, areas in contact with the outside (specifically, the pad electrodes 34 facing the pad electrodes 56a to 56j) become uneven. In this exemplary embodiment, therefore, each of the pad electrodes is adapted to have at least one top having approximately the same height L1. In order to adjust the pad electrodes 56a to 56j so that their tops have approximately the same height L1, semiconductor films (or insulating films) that do not directly contribute to the configuration of the thin-film electrical circuit are appropriately provided to serve as height adjusting films. In addition, the respective pad electrodes 56a to 56j have the same film structure of stacked films in the regions associated with their tops.

In the example shown in FIGS. 5A and 5B, the bottom of the chip 34 serves as a "reference face" to define the height L1 of each top. However, the reference face is not limited to this and may be another plane that can serve as a common reference (for example, a face on which the thin-film line 50a and the like are provided or a face on which the semiconductor film 52e and the like are provided).

A detailed description is given below of the plural pad electrodes 36 provided on each pixel 101, the pad electrodes 36 being paired with the pad electrodes 56a to 56j provided on the above-described chip 34.

Figure 7A:
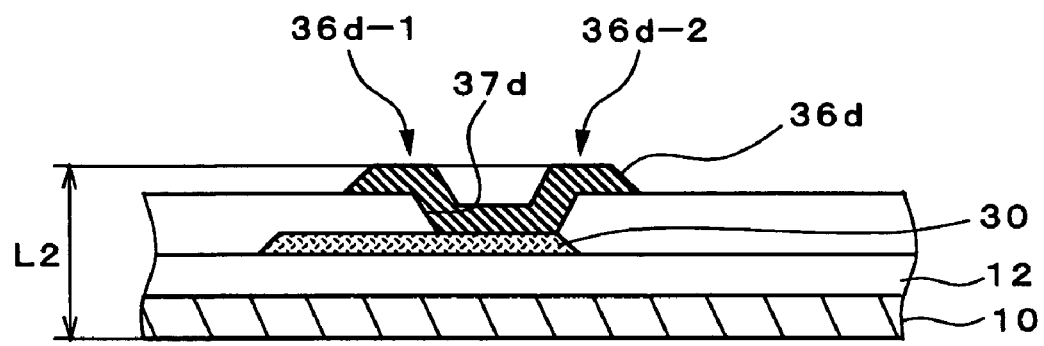
FIGS. 7A and 7B are schematics describing the pad electrodes formed on the pixel.
Figure 7B:
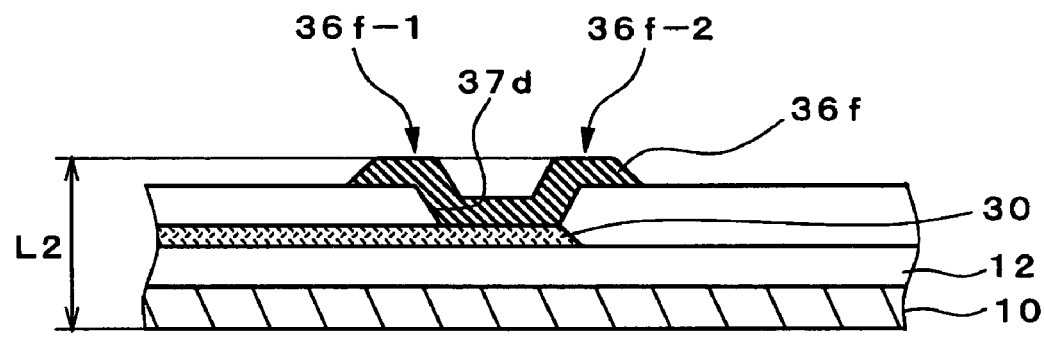

FIGS. 6-7B are schematics describing the pad electrodes 36 provided on the pixel 101. FIG. 6 is an enlarged view of a region including the pad electrodes 36 of the pixel 101 shown in FIGS. 2A and 2B. To simplify the description, the pad electrodes 36 are distinguished by designating them as pad electrodes 36a to 36j. The pad electrodes 36a to 36j are associated with the pad electrodes 56a to 56j on the chip 34, respectively. FIG. 7A is a sectional view of the pad electrode 36d taken along Plane D-D' of FIG. 6. FIG. 7B is a sectional view of the pad electrode 36f taken along Plane E-E' of FIG. 6.

As shown in FIG. 7A, the pad electrode 36d has two "tops", which have the greatest height from the bottom of the substrate 10 on which the pixel 101 is arranged. These two tops 36d-1 and 36d-2 have height L2 from the bottom of the substrate 10. As shown in FIG. 7B, the pad electrode 36f has two tops 36f-1 and 36f-2. These tops 36f-1 and 36f-2 have height L2. Furthermore, each of the other pad electrode 36a and the like, which are not shown, has at least one top of height L2 from the bottom of the substrate 10.

Specifically, since the pad electrodes 34*a* to 34*j* are formed on the top side of the electrical circuit wiring including the wiring layers and the insulating layers, which are stacked on top of another, areas in contact with the outside (specifically, the pad electrodes 56*a* and the like facing the pad electrodes 34*a* to 34*j*) become uneven. In this exemplary embodiment, therefore, the pad electrodes are adapted to each have at least one top having approximately the same height L2. In addition, the pad electrodes 34*a* to 34*j* have the same film structure of stacked films in the regions associated with their tops.

In the example shown in FIGS. 7A and 7B, height adjusting films are not particularly provided. However, such height adjusting films may be necessary depending on the positions at which the pad electrodes are arranged. In such a case, to adjust the pad electrodes so that their tops have approximately the same height L2, insulating films or the like that do not directly contribute to the configuration of the electrical circuit wiring are appropriately provided to serve as height adjusting films. A specific method is similar to that in the case of the above-described pad electrodes 56*a* and the like (see FIG. 5).

The chip 34 of this exemplary embodiment has the above-described structure. A method of manufacturing the organic EL display device of this exemplary embodiment is described below. In this exemplary embodiment, transfer technology is used in which a plurality of above-described chips 34 are formed on a transfer source substrate, and, subsequently, these chips 34 are ablated from a first substrate and transferred to a substrate included in the organic EL display device. In the following description, a method of transferring the chips 34 is described in detail below.

FIGS. 8A-9C illustrate a manufacturing method according to this exemplary embodiment. The transfer method includes the following first to fifth steps.

<First Step>

Figure 8A:
FIGS. 8A-8E are schematics describing a manufacturing method according to an exemplary embodiment.

In the first step, as shown in FIG. 8A, an ablation layer (optical absorption layer) 62 is formed on a transfer source substrate 60.

Preferably, the transfer source substrate 60 has optical transparency so that light passes through the transfer source substrate 60. Accordingly, the ablation layer can be irradiated with light via the transfer source substrate, thereby quickly and accurately ablating the ablation layer by light irradiation. In this case, the light transmittance of the transfer source substrate is preferably 10% or greater, and more preferably, 50% or greater. The higher the transmittance, the smaller the loss of light. As a result, the ablation layer 62 may be ablated by lower light intensity.

Preferably, the transfer source substrate 60 is made of a highly reliable material. In particular, it is preferable that the transfer source substrate 60 be made of a material with high heat resistance. This is because, for example, when the chip 34 serving as a to-be-transferred piece is formed, the processing temperature may be high (for example, approximately 350 to 1000° C.) depending on the type and the forming method. Even in such a case, if the transfer source substrate 60 has high heat resistance, upon formation of the chip 34 on the transfer source substrate 60, the range of film deposition conditions including a temperature condition is expanded. As a result, many chips can be manufactured on a transfer source substrate at a desired high temperature. Reliable and high-performance elements and circuits are thus manufactured.

Assuming that Tmax is the highest temperature upon formation of the chip 34, preferably the transfer source substrate 60 is made of a material whose strain point is greater than or equal to Tmax. Specifically, the transfer source substrate 60 is preferably made of a material whose strain point is greater than or equal to 350° C., and more preferably, made of a material whose strain point is greater than or equal to 500° C. Examples of such material include heat-resistant glass, such as quartz glass, Corning 7059, Nippon Denki Glass OA-2, etc., for example.

The thickness of the transfer source substrate 60 is not limited to a particular thickness. In general, the thickness is preferably approximately 0.1 to 5.0 mm, and more preferably approximately 0.5 to 1.5 mm. The thicker the transfer source substrate 60, the higher the strength becomes. The thinner the transfer source substrate 60, the smaller the amount of light lost even when the transmittance of the transfer source substrate 60 is low. When the light transmittance of the transfer source substrate 60 is high, the thickness may exceed the above-described upper limit. Furthermore, to perform uniform irradiation, it is preferable that the thickness of the transfer source substrate 60 be uniform.

As described above, there are various conditions concerning the transfer source substrate. Unlike a transfer destination substrate that becomes a final product, however, the transfer source substrate can be repeatedly used so that even when the transfer source substrate is made of a relatively expensive material, an increase in manufacturing cost can be suppressed by repeatedly using the transfer source substrate.

The ablation layer 62 has a characteristic such that the ablation layer 62 absorbs irradiation light to cause ablation within the layer and/or on the surface (hereinafter "interlayer ablation" and "surface peeing"). Preferably, the ablation layer 62 is made of such a material that, due to light irradiation, the bonding strength between atoms or molecules of the material forming the ablation layer 62 disappears or is reduced, that is, ablation takes place, resulting in interlayer ablation and/or surface ablation.

There is a case that due to light irradiation, the ablation layer 62 emits gas, resulting in generation of a separation effect. Specifically, a component contained in the ablation layer 62 is converted to gas and emitted. Alternatively, the ablation layer 62 absorbs light and, for a moment, becomes gas, which in turn is evaporated, thus contributing to the separation. The composition of the ablation layer 62 described above includes, for example, the following A to F.

(A) Amorphous silicon (a-Si)

This amorphous silicon may contain hydrogen (H). In this case, H content is preferably approximately 2 atomic percent or greater, and more preferably approximately 2 to 20 atomic percent.

(B) Various oxide ceramics, such as silicon oxide, silicate compound, titanium oxide, titanate compound, zirconium oxide, zirconate compound, lanthanum oxide, and lanthanate compound, dielectrics (ferroelectrics), or semiconductor.

(C) Ceramics, such as PZT, PLZT, PLLZT, and PBZT, or dielectrics (ferroelectrics).

(D) Nitride ceramics, such as silicon nitride, aluminum nitride, and titanium nitride.

(E) Organic polymeric materials

Organic polymeric materials include bonds (to be broken by light irradiation), such as —CH—, —CO— (ketone), —CONH— (amide), —NH— (imide), —COO— (ester), —N=N— (azo), and —CH=N— (Schiff), and, in particular, any material containing many of these bonds. Alternatively, an organic polymeric material including, in its constitutive equation, aromatic hydrocarbon (one or plural benzene rings or a condensed ring thereof) may be used.

Specific examples of these organic polymeric materials include polyolefin, such as polyethylene or polypropylene, polyimide, polyamide, polyester, polymethyl metacrylate (PMMA), polyphenylene sulfide (PPS), polyether sulfone (PES), epoxy resin, etc.

(F) Metals

Metals include, for example, Al, Li, Ti, Mn, In, Sn, Y, La, Ce, Nd, Pr, Gd, Sm, and an alloy including at least one of these metals. The ablation layer may be formed of a hydrogen-containing alloy. When such a hydrogen-containing alloy is used to form the ablation layer, hydrogen is emitted due to light irradiation. Accordingly, ablation in the ablation layer is promoted.

The ablation layer may be formed of a nitrogen-containing alloy. When such a nitrogen-containing alloy is used to form the ablation layer, nitrogen is emitted due to light irradiation. Accordingly, ablation in the ablation layer is promoted. Alternatively, the ablation layer may be formed of a multi-layer film. The multi-layer film includes, for example, an amorphous silicon film and a metal film on the amorphous silicon film. Materials of the multi-layer film may include at least one type of the above-described ceramics, metals, and organic polymeric materials.

The method of forming the ablation layer 62 is not limited to a particular method and may be appropriately selected in accordance with various conditions, such as the film composition, the film thickness, etc. The ablation layer 62 may be formed by, for example, various vapor deposition methods including CVD and sputtering, various plating methods, an application method including spin coating, various printing methods, a transfer method, inkjet coating, powder jetting, etc. Two or more of these methods may be combined to form the ablation layer 62.

Although not shown in FIG. 8A, in accordance with the properties of the transfer source substrate 60 and the ablation layer 62, an intermediate layer may be provided between the transfer source substrate 60 and the ablation layer 62 to enhance adhesion between the two. This intermediate layer carries out a function of at least one of a protective layer to physically or chemically protect a to-be-transferred layer during manufacture or use, an insulating layer, a barrier layer to prevent migration of components to/from the to-be-transferred layer, and a reflective layer.

<Second Step>

Figure 8B:
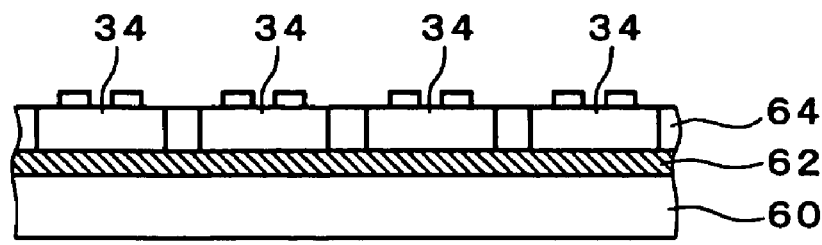

The second step will now be described. In the second step, as shown in FIG. 8B, a plurality of chips 34 is formed on the ablation layer 62. A layer including these plural chips 34 is referred to as a to-be-transferred layer 64.

The production of TFTs requires a relatively high temperature process. A substrate on which TFTs and the like are formed must satisfy various conditions similarly to the transfer source substrate. In the manufacturing method of this exemplary embodiment, it is possible that TFTs are produced on a transfer source substrate that satisfies various manufacturing conditions, and subsequently these TFTs are transferred to a final substrate that does not satisfy these manufacturing conditions. In other words, in the manufacturing method of this exemplary embodiment, a substrate made of an inexpensive material can be used as a final substrate, thus reducing the manufacturing cost. Alternatively, a flexible substrate can be used as a final substrate. The range of choice of final substrates is thus extended.

Separation of the chips 34 in the to-be-transferred layer 64 is described below. Possible separation methods of separating the chips 34 include a method of separating the chips 34 by etching or the like, a method in which no special structure is used to separate the chips 34, a method of separating only the ablation layer, and a method in which a predetermined structure is formed on the transfer source substrate to make the individual to-be-transferred pieces easily separated. Hereinafter a method of completely separating the individual chips 34 is described below.

Figure 8C:
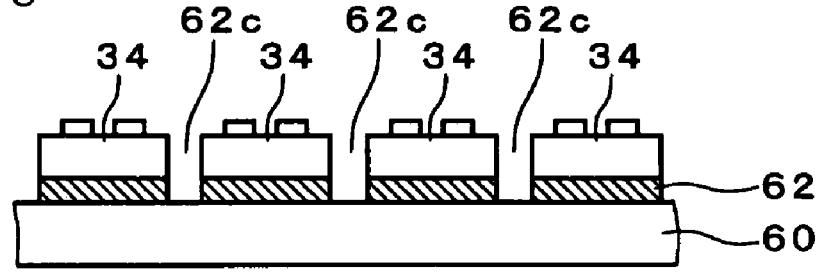
Figure 8D:
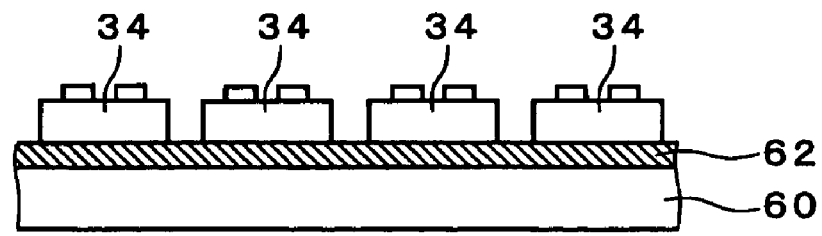

As shown in FIG. 8C, to separate the individual chips 34, grooves 62c serving as recesses are formed by wet etching, dry etching, or the like around the periphery of regions associated with the chips 34, thus leaving the chips 34 as islands. These grooves 62c are formed by cutting off, in the direction of the substrate thickness, the entire to-be-transferred layer 64 and the entirety (see FIG. 8C) or part (see FIG. 8D) of the ablation layer 62. Alternatively, the cut-off may be shallower and only limited to the to-be-transferred layer 64. The grooves 62c may be formed by, as shown in FIG. 8D, etching up to part of the ablation layer 62 or, as shown in FIG. 8C, etching the entire ablation layer 62, thus leaving the chips 34 and the ablation layer 62 immediately below the chips 34 as the same island shape. By forming the same chips 34 and etching the chips 34 with the same pitch, these to-be-transferred pieces are aligned on the transfer source substrate 60. In an ablation step (the fourth and fifth steps, which is described below), only desired chips 34 are easily transferred.

Since the to-be-transferred layer 64 is cut off in advance, part of an ablation portion can be accurately ablated along the shape of a region of the to-be-transferred layer 64. It thus becomes possible that this region is prevented from being damaged upon ablation. It also becomes possible that a rupture in the to-be-transferred layer 64 due to ablation is prevented from extending to adjacent regions. Furthermore, since the cut-off is carried out in the film thickness direction, even when the bonding strength of an adhesive layer of bonding the specific chip 34 to the transfer destination substrate is weak, this chip 34 can be ablated. In addition, since the appearance of a transfer target region is clear, alignment between the substrates upon transfer is facilitated.

Figure 8E:
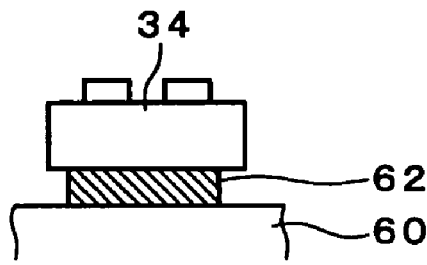

As shown in FIG. 8E, the ablation layer 62 may be over-etched so that an adhesive area of the ablation layer 62 with respect to the chips 34 is smaller than the total area of the bonded surfaces of the to-be-transferred pieces to the ablation layer 62. By over-etching the ablation layer 62 in this way, the area of the ablation layer 62 is reduced. As a result, when the ablation layer 62 is irradiated with light to be ablated, the ablation layer 62 can be reliably ablated with a smaller intensity. Since the ablation layer 62 is reduced in size, the amount of optical energy required to ablate the ablation layer 62 can be reduced.

Furthermore, as shown in FIG. 8D, only the to-be-transferred layer 64 may be etched to form the grooves 62c, thus leaving the ablation layer 62 continuous. When energy can be uniformly applied to the regions in which the chips 34 are provided, ablation is reliably caused in the ablation layer 62 adjacent to these regions. Therefore, even when the ablation layer 62 itself has no cracks, only desired to-be-transferred pieces can be ablated.

<Third Step>

Figure 9A:
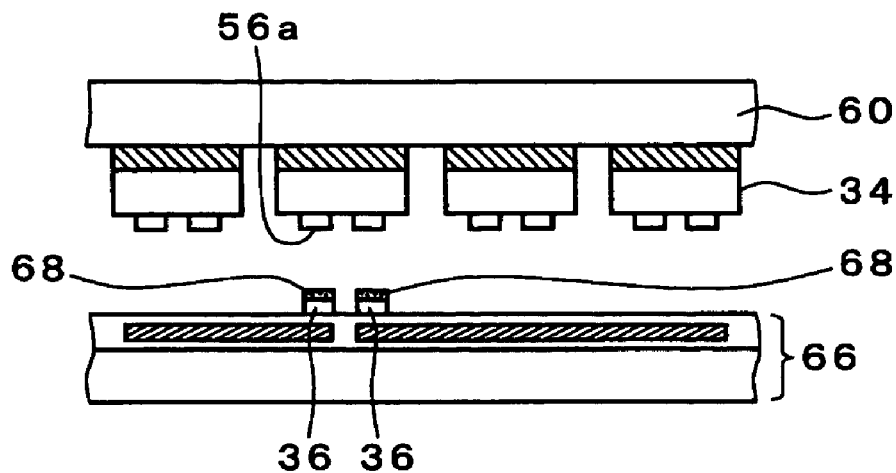
FIGS. 9A-9C are schematics describing the manufacturing method according to the exemplary embodiment.

Next, as shown in FIG. 9A, the face of the transfer source substrate 60 on which the chips 34 are disposed is aligned and bonded with the face of a transfer destination substrate 66 on which the chips 34 are to be transferred. Where necessary, pressure is applied so that only the chips 34 to be transferred are selectively bonded to the transfer destination substrate 66 via conductive adhesive layers 68.

In this exemplary embodiment, the above-described substrate 10 (see FIGS. 2A and 2B) on which the first wiring layer 12 is formed, and the lines 30 and the pad electrodes 36 are formed on the first wiring layer 12 corresponds to the transfer destination substrate 66 shown in FIG. 9A. The pad electrodes 36 included in the transfer destination substrate 66 are brought into contact with the pad electrodes 56a and the like on the chips 34 to be transferred, thus bonding the chips 34.

Preferred examples of adhesives constituting the above-described adhesive layers 68 include light-hardening adhesives, such as a reactive-hardening adhesive, a heat-hardening adhesive, and a UV-hardening adhesive, and various hardening adhesives, such as an anaerobic hardening adhesive. The composition of the adhesive can be of any type, for example, epoxy-base, acrylate-base, and silicone-base. When a commercial adhesive is used, it may be dissolved in an appropriate solvent to achieve a viscosity appropriate for application.

In this exemplary embodiment, the adhesive layers 68 are formed only on the chips 34 to be transferred or only on the transfer destination substrate 66 associated with the chips 34 to be transferred. Such local deposition of the adhesive layers 68 can be performed by various printing methods or liquid discharge methods. Liquid discharge methods include a piezoelectric jetting method of discharging liquid using deformation of a piezo-electric crystal and a method of discharging liquid by generating bubbles by heat. In this exemplary embodiment, the adhesive layers 68 are explained as being formed by an inkjet coating (liquid discharge method).

Furthermore, as shown in FIG. 10, an adhesive layer 69 is preferably formed using an anisotropic conductive film including conductive particles. In this case, the pad electrodes need not be individually provided with adhesive layers. The alignment accuracy is thus not very critical, and formation of the adhesive layer becomes easy.

<Fourth Step>

Figure 9B:
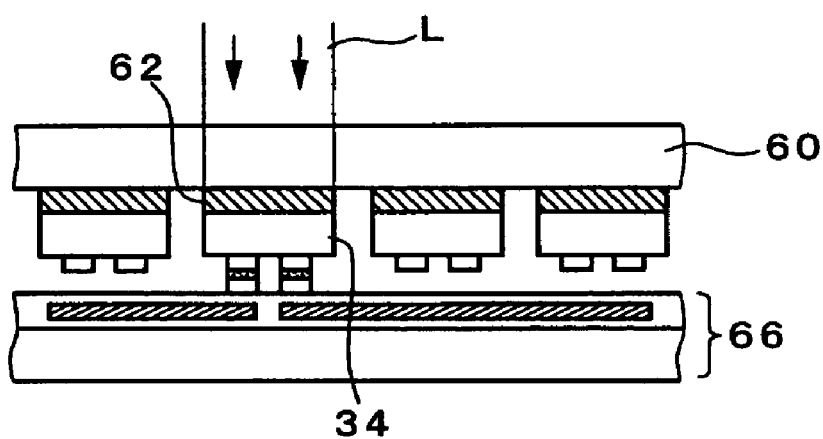

Next, as shown in FIG. 9B, from the transfer source substrate 60 side of the bonded piece consisting of the transfer source substrate 60 and the transfer destination substrate 66, only the ablation layer 62 adjacent to the chips 34 to be transferred is selectively irradiated with light L, thus causing ablation (interlayer ablation and/or surface ablation) only in the ablation layer 62 supporting the chips 34 to be transferred.

Interlayer ablation and/or surface ablation occurs in the ablation layer 62 due to ablation of materials forming the ablation layer 62, emission of gas contained in the ablation layer 62, or phase change, such as melting or evaporation, that takes place immediately after the irradiation.

Here, ablation means that fixed materials (materials forming the ablation layer 62) that have absorbed irradiation light are photochemically or thermally excited to break the bond between atoms or molecules on the surface or in the interior of the ablation layer 62, resulting in emission of the atoms or molecules. Primarily, ablation shows up as a phenomenon that all or some of the materials forming the ablation layer 62 are melted, evaporated (vaporized), etc, resulting in phase change. Or, due to the phase change, micro bubbles are generated, which in turn may reduce the bonding strength.

Whether interlayer ablation, surface ablation, or both types of ablation occur in the ablation layer 62 depends on the composition of the ablation layer 62 and various other factors. One of the factors is the conditions concerning irradiation light, such as the type, wavelength, intensity, and how deep it goes.

The irradiation light L may be of any type as long as it causes interlayer ablation and/or surface ablation in the ablation layer 62. For example, X-rays, UV-rays, visible light, infrared light, laser light, etc., may be used.

Of these types, laser light is preferred since laser light easily causes ablation of the ablation layer 62 and is capable of performing local irradiation with high accuracy. Preferably, laser light has a wavelength of 100 nm to 350 nm. Using such short-wavelength laser light, the accuracy of light irradiation is increased, and ablation of the ablation layer 62 is effectively caused.

As a laser device to generate such laser light, an excimer laser is preferably used. Since an excimer laser outputs high energy in the short wavelength region, ablation is caused in the ablation layer 62 within a very short period of time. Therefore, the ablation layer 62 can be ablated without causing almost no increase in temperature of the adjacent transfer destination substrate 66 and the first substrate 60, and without causing degradation and damage to the chips 34 and the like.

Alternatively, when separation characteristics are given by causing a phase change, such as gas emission, evaporation, or sublimation, it is preferable that the wavelength of irradiated laser light be approximately 350 nm to 1200 nm. Laser light having such a wavelength is generated by a YAG or a gas laser which is a laser source or lighting system widely used in general fabrication fields. Light irradiation is thus easily performed at low cost. Furthermore, when laser light having such a wavelength in the visible light region is used, the transfer source substrate 60 has only to be translucent to visible light, which expands the freedom of selecting the transfer source substrate 60.

The energy density of irradiated laser light, particularly in the case of an excimer laser, is preferably approximately 10 to 5000 mJ/cm$^2$, and more preferably approximately 100 to 500 mJ/cm$^2$. The irradiation time is preferably approximately 1 to 1000 nsec, and more preferably approximately 10 to 100 nsec. The higher the energy density and the longer the irradiation time, the more easily ablation occurs. In contrast, the lower the energy density and the shorter the irradiation time, the less probable the irradiation light that has been transmitted through the ablation layer 62 has an adverse influence on the chips 34 and the like.

<Fifth Step>

Figure 9C:
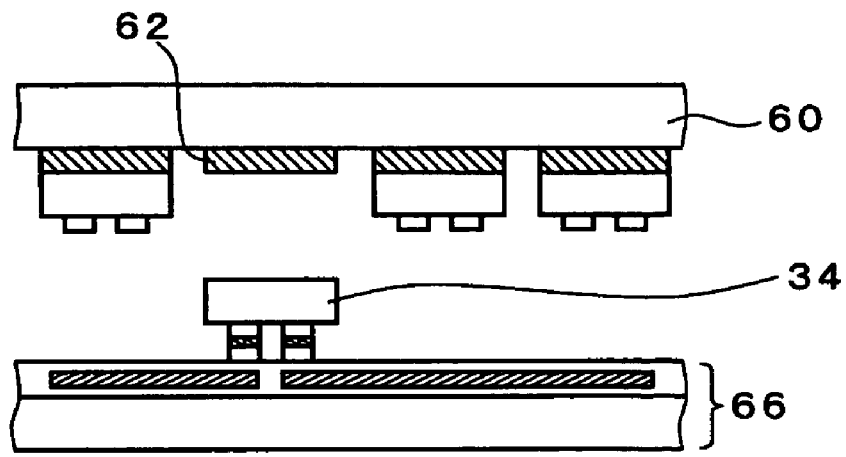

As shown in FIG. 9C, force is applied to the transfer source substrate 60 and the transfer destination substrate 66 so as to remove one substrate from the other, thus removing the transfer source substrate 60 from the transfer destination substrate 66. Since the ablation layer 62 adjacent to the chips 34 to be transferred to the transfer destination substrate 66 has been ablated from the chips 34 in the fourth step, the chips 34 to be transferred are disconnected from the first substrate 60. The chips 34 to be transferred are bonded to the transfer destination substrate 66 using the adhesive layers 68.

It is desirable that the ablation layer 62 be completely ablated in the fourth step. However, only part of the ablation layer 62 may be ablated if the adhesive strength of the adhesive layer 68 adjacent to each chip 34 to be transferred is higher than the bonding strength of the remaining ablation layer 62, and as a result, the chip 34 to be transferred will be reliably transferred upon removal of the transfer source substrate 60 from the transfer destination substrate 66.

As described above, each to-be-transferred piece is transferred in accordance with the strength relationship between the bonding strength of an ablation layer, which is weakened by ablation of the ablation layer, and the bonding strength of an adhesive layer applied to the to-be-transferred piece. If ablation of the ablation layer is sufficient, the to-be-transferred piece can be transferred even when the bonding strength of the adhesive layer is weak. In contrast, even when ablation of the ablation layer is not sufficient, the to-be-transferred piece can be transferred if the bonding strength of the adhesive layer is high.

As shown in FIG. 9C, upon removal of the transfer source substrate 60 from the transfer destination substrate 66, the chips 34 are transferred at desired positions on the transfer destination substrate 66. Subsequently, an insulating film or the like covering the chips 34 and the like is formed, thus forming the second wiring layer 14 shown in FIG. 2. As a result, a circuit board is completed. The light emitting element layer 16 is formed on the second wiring layer 14, thus forming the organic EL display device 100.

The chips 34 transferred to the transfer destination substrate 66 may have a residual portion of the ablation layer 62 attached thereto. It is desirable to completely remove this portion. A method of removing the residual ablation layer 62 may be appropriately selected from among, for example, cleaning, etching, ashing, grinding, and a combination of these methods.

Similarly, when the surface of the transfer source substrate 60 from which the chips 34 have been transferred has a residual portion of the ablation layer 62 attached thereto, this portion can be removed, as in the above-described transfer destination substrate 66. Accordingly, the transfer source substrate 60 can be reused (recycled). Reusing the transfer source substrate 60 eliminates the wasted part of the manufacturing cost. This is particularly effective when the transfer source substrate 60 made of an expensive and rare material, such as quartz glass, is used.

In this exemplary embodiment, the pad electrodes provided on the chips 34 and the pad electrodes provided on the transfer destination substrate 66 (substrate 10 on which the pixel 101 is provided) are formed such way that their tops, that is, the highest portions, of rough surface portions have approximately the same height. As a result, areas of the chips 34 that are brought into contact with the transfer target region of the substrate 10 when transferring the chips 34 have approximately the same height. Satisfactory connections are thus reliably established.

Various electronic apparatuses including the organic EL display device 100 of this exemplary embodiment are described below. FIGS. 11A-11D are schematics of specific examples of electronic apparatuses to which the organic EL display device 100 of this exemplary embodiment can be applied.

FIG. 11A shows an example of application to a cellular phone. A cellular phone 230 includes an antenna 231, an audio output unit 232, an audio input unit 233, an operation unit 234, and the organic EL display device 100 of this exemplary embodiment. In this way, the display device according to the present invention can be used as a display unit.

FIG. 11B shows an example of application to a video camera. A video camera 240 includes an image receiving unit 241, an operation unit 242, an audio input unit 243, and the organic EL display device 100 of this exemplary embodiment. In this way, the display device according to the present invention can be used as a viewfinder or a display unit.

FIG. 11C shows an example of application to a mobile personal computer. A computer 250 includes a camera unit 251, an operation unit 252, and the organic EL display device 100 of this exemplary embodiment. In this way, the display device according to the present invention can be used as a display unit.

FIG. 11D shows an example of application to a head-mounted display. A head-mounted display 260 includes a band 261, an optical system storage unit 262, and the organic EL display device 100 of this exemplary embodiment. The display device according to the present invention can be used as an image display source in this way.

The display device 100 according to the present invention is not limited to the application of the above-described examples and is applicable to various electronic apparatuses, such as a facsimile machine with a display function, a finder of a digital camera, a mobile TV, and an electronic notebook, for example.

Furthermore, the present invention is not limited to the contents of the above-described exemplary embodiments, and various modifications can be made within the scope of the present invention. For example, in the above-described exemplary embodiment, the heights of the "tops" of the pad electrodes 56a to 56j are adjusted to L1, and the heights of the "tops" of the pad electrodes 36a to 36j are adjusted to L2, however, advantages similar to those of the above-described exemplary embodiment can be achieved by forming pad electrodes such way that the sums of the heights of the tops of rough surface portions of pairs of pad electrodes facing each other are approximately constant.

Figure 12:
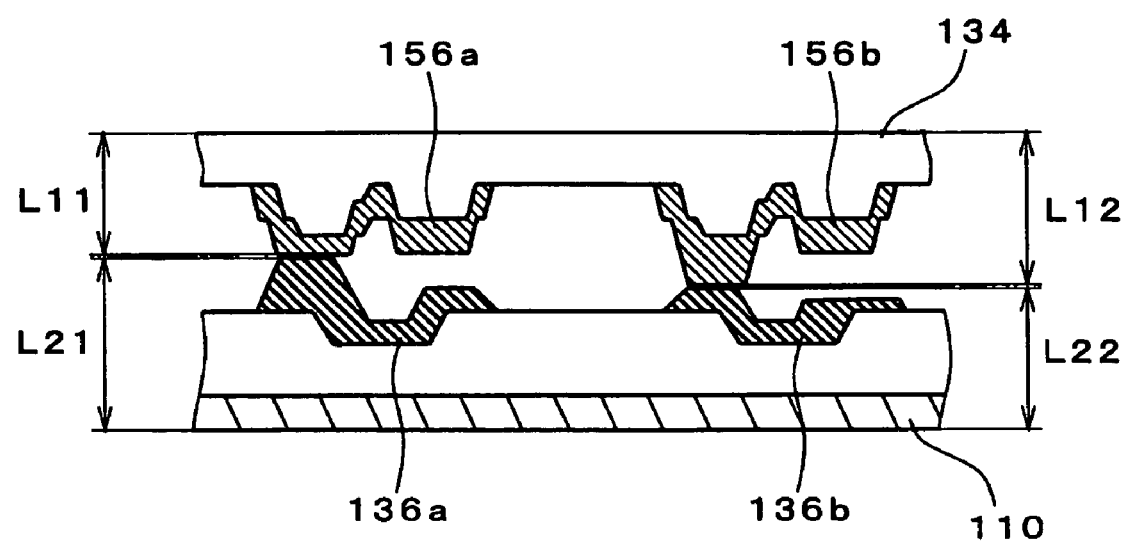
FIG. 12 is a schematic describing a case in which the sums of heights of tops of pairs of pad electrodes facing each other are kept approximately constant.

FIG. 12 is a schematic describing a case in which the sums of heights of tops of pairs of pad electrodes facing each other are kept approximately constant. Referring to FIG. 12, a pad electrode 136a and a pad electrode 156a are paired and disposed facing each other, and a pad electrode 136b and a pad electrode 156b are paired and disposed facing each other. Films stacked below the respective pad electrodes are omitted in FIGS. 2A and 2B.

The pad electrodes provided on a transfer chip 134 are formed such way that the height of the top of the pad electrode 156a is L11 and the height of the top of the pad electrode 156b is L12. That is, the tops of the pad electrodes 156a and 156b differ from each other. The pad electrodes provided on a substrate 110 are formed such way that the height of the top of the pad electrode 136a is L21 and the height of the top of the pad electrode 136b is L22. That is, the tops of the pad electrodes 136a and 136b differ from each other. However, referring to the heights of the tops of the pairs of pad electrodes, the pad electrodes are formed such way that the sum of the heights of the tops of the pad electrode 136a and the pad electrode 156a is approximately the same as the sum of the heights of the tops of the pad electrode 136b and the pad electrode 156b.

Thus, in the exemplary embodiment shown in FIG. 12, the pad electrodes are formed such way that the sums of the heights of the tops of pairs of pad electrodes become approximately constant. When the pad electrodes are formed in this manner, electrical connections are established in a more reliable manner.

In the above-described exemplary embodiment, the organic EL display device serving as an example of an electro-optical device according to the present invention has been described. However, the applicable scope of the present invention is not limited to this organic EL display device. The present invention is also applicable to an electro-optical device including various other electro-optical elements (e.g., plasma light emitting elements, electrophoretic elements, liquid crystal elements, and the like, for example). The applicable scope of the present invention is not limited to an electro-optical device and a method of manufacturing the same. The present invention is widely applicable to various devices produced using transfer technology.

What is claimed is:

1. A circuit board manufacturing method, comprising:
   forming a transfer chip on and above a first substrate, the transfer chip having (1) a bottom adjacent the first substrate, (2) a thin-film electrical circuit formed of stacked films above the first substrate and the bottom and (3) a plurality of transfer chip pad electrodes formed above the stacked films, the pad electrodes including a first pad electrode having a first top positioned at a highest level within the first pad electrode and a second pad electrode having a second top positioned at a highest level within the second pad electrode, the first pad electrode having a first height measured from the bottom of the transfer chip to the first top of the first pad electrode, and the second pad electrode having a second height measured from the bottom of the transfer chip to the second top of the second pad electrode;

forming a transfer region on a second substrate, the transfer region having (1) electrical circuit wiring and (2) a plurality of transfer region pad electrodes connected to the electrical circuit wiring;

adjusting at least one of the first height and the second height by adding at least one height adjusting film so that the first height becomes substantially the same as the second height; and joining the transfer chip to the transfer region on the second substrate, such that the thin-film electrical circuit is electrically connected to the electrical circuit wiring via contact between respective ones of the transfer chip pad electrodes and the transfer region pad electrodes.

2. The circuit board manufacturing method according to claim 1, the plurality of transfer region pad electrodes including a third pad electrode and a fourth pad electrode, the joining of the transfer chip being carried out such that the first pad electrode contacts the third pad electrode.

3. The circuit board manufacturing method according to claim 2, the joining of the transfer chip being carried out such that the second pad electrode contacts the fourth pad electrode.

4. The circuit board manufacturing method according to claim 1, the plurality of transfer region pad electrodes including (1) a third pad electrode that has a third top positioned at a highest level within the third pad electrode, the third pad electrode having a third height measured from a bottom of the transfer region to the third top, and (2) a fourth pad electrode that has a fourth top positioned at a highest level within the fourth pad electrode, the fourth pad electrode having a fourth height measured from the bottom of the transfer region to the fourth top, and the third height and the fourth height being different from each other.

5. The circuit board manufacturing method according to claim 4, wherein the first height of the first pad electrode is adjusted by a first amount and the second height of the second pad electrode is adjusted by a second amount, and the joining of the transfer chip being carried out such that the first pad electrode and the second pad electrode contact the third pad electrode and the fourth pad electrode, respectively, the first amount and the second amount being selected such that, after joining, the transfer chip and the transfer region maintain a common horizontal level.

* * * * *